United States Patent [19]

Tangonan et al.

[11] 4,348,587
[45] Sep. 7, 1982

[54] FIBER OPTIC TRANSDUCER FOR MEASURING CURRENT OR MAGNETIC FIELD

[75] Inventors: Gregory L. Tangonan, Oxnard; Robert J. Morrison, Thousand Oaks; Joseph A. Wysocki, Oxnard; David L. Persechini, Santa Monica, all of Calif.

[73] Assignee: Hughes Aircraft Company, Culver City, Calif.

[21] Appl. No.: 207,107

[22] Filed: Nov. 17, 1980

[51] Int. Cl.$^3$ .............................................. G01R 31/00
[52] U.S. Cl. ...................................... 250/227; 324/96; 324/117 R
[58] Field of Search ............. 250/227; 324/96, 117 R, 324/244

[56] References Cited

U.S. PATENT DOCUMENTS 3,936,742 2/1976 Krause .................................... 324/96
4,070,622 1/1978 Harms et al. .......................... 324/96

Primary Examiner—David C. Nelms
Assistant Examiner—Darwin R. Hostetter
Attorney, Agent, or Firm—David W. Collins; W. H. MacAllister

[57] ABSTRACT

A multi-mode optical fiber is used to detect electrical currents or magnetic fields from a remote source. The optical fiber, which serves as the sensor, is composited with metal capable of conducting electricity. Optical radiation is introduced into the fiber from a source which may be either coherent or incoherent. An electrical current is applied to the portion of the electrically conducting optical fiber and a magnetic field is applied to the current-carrying optical fiber. A known value of one permits a determination of the presence or absence of the other through electromotive forces on a metallic conductor in a magnetic field, which are used to induce differential phase shifts (coherent optical radiation input) or losses (incoherent optical radiation input) between the fiber modes. These phase shifts or losses are detected by a suitable detector. For a magnetic field of 1 kGauss, good linearity is obtained in the 5 to 2,000 mA current range. Magnetic fields of about 0.1 G to 1 kG are detected employing a current source of about 5 mA to 50 A.

10 Claims, 5 Drawing Figures

FIBER OPTIC TRANSDUCER FOR MEASURING CURRENT OR MAGNETIC FIELD

BACKGROUND OF THE INVENTION

1. Field of the Invention

This invention relates to fiber optic transducers and, in particular, to a composite metal/optical fiber structure suitable for detecting either an electrical current or a magnetic field.

2. Description of the Prior Art

Sensor development is an area of considerable interest in non-telecommunication applications of fiber optic technology. For example, current sensing is being pursued with applications envisioned such as electrical power monitoring and industrial process control. To date, the research in current sensors has concentrated on single mode fiber sensors. These current sensors exploit the Faraday effect (polarization rotation proportional to a magnetic field) generated by a high current bus bar. The major problems with this approach are the small Verdet constant of high quality optical glass fiber, maintenance of low birefringence for long lengths and temperature stability. Due to the weak paramagnetic properties of glass, only high currents in the order of 5 to 800 Amps can be sensed by measurement of phase change. The use of single mode optical fibers in these sensors requires an interferometer configuration for phase change measurements.

SUMMARY OF THE INVENTION

In accordance with the invention, a fiber optic transducer includes:
(a) a multi-mode optical fiber adapted to transmit optical radiation, at least a portion of the fiber also adapted to conduct electricity;
(b) means for introducing optical radiation into the optical fiber;
(c) means for impressing a current on the portion adapted to conduct electricity;
(d) means for applying a magnetic field to a portion of the current-carrying optical fiber; and
(e) means for providing an optical output.

Applying a magnetic field of known strength in conjunction with a source of optical radiation and a detector for detecting the optical output permits sensing of the presence or absence of an electrical current. The current sensor of the invention is particularly useful for electrical devices operating in remote environments, such as motors in power plants, pumps in nuclear reactors and other situations in which it is necessary to know whether an electrical device located in a hazardous area is operating.

Alternatively, applying an electrical current of known value, again, in conjunction with a source of optical radiation and a detector, permits sensing of the presence or absence of a magnetic field.

In both the current sensor and the magnetic field sensor, multi-mode optical fibers are employed. Such fibers avoid the problems inherent in the use of single mode fibers.

The fiber optic transducer is capable of detecting electrical currents from less than 5 mA to over 2 A or magnetic fields from less than 0.1 G over 1 kG.

DETAILED DESCRIPTION OF THE INVENTION

Figure 1:
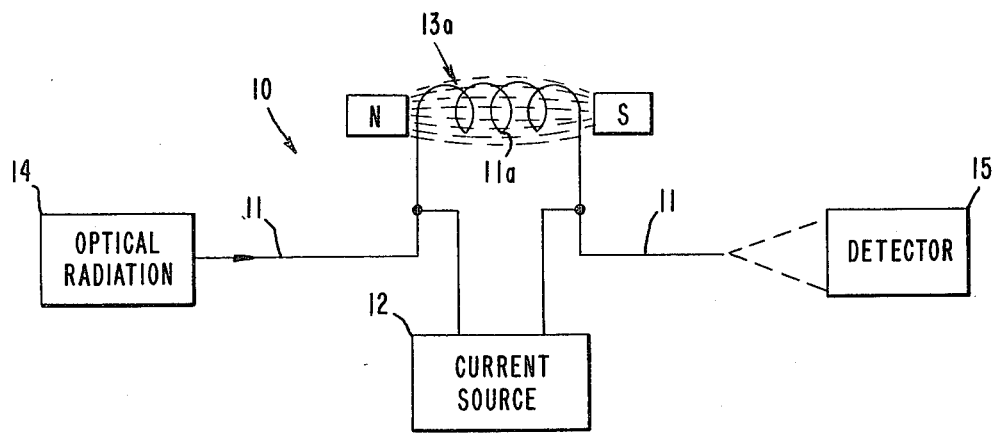
FIG. 1 depicts schematically a fiber optic transducer and associated apparatus of the invention.

FIG. 1 depicts schematically a fiber optic transducer 10. A multi-mode optical fiber 11 is adapted to transmit optical radiation. At least a portion 11a of the fiber is adapted to conduct electricity. Means are provided for introducing optical radiation into the optical fiber. Means 12 are also provided for impressing a current onto the electrically conducting portion 11a of the optical fiber. A portion of the optical fiber upon which current is impressed is exposed to a magnetic field 13a, generated by magnets (labeled N-S). The interaction of the magnetic field on the current, if any, causes flexure of, or microbends in, the optical fiber. Such action affects the optical output of the fiber.

In operation, the transducer additionally includes a source 14 of optical radiation connected to the input end of the optical fiber 11 through an appropriate connector (not shown). Also, a detector 15 is connected to the output end of the optical fiber 11, again, through an appropriate connector (not shown).

A composite metal/optical fiber serves the dual purpose of conducting electricity and transmitting optical radiation. In operation, when current is passed through the metal portion and a magnetic field is applied to the metal/optical fiber composite, the magnetic force on the current-carrying portion includes bending or flexure of the fiber. Microbends induce relative phase differences between the various guided modes and radiation loss. The phase modulation of optical transmission may be measured by monitoring a part of the radiation pattern emanating from the optical fiber 11. A detector 15 may be used to detect either loss modulation or phase modulation. For loss modulation, any light source may be employed, while for phase modulation, a coherent source of optical radiation, such as emitted from a laser, is employed. In the latter situation, a speckle pattern is generated which shifts as a function of phase changes induced by the current/magnetic field interaction. This detection technique requires that the detector sense a part of the speckle pattern. The intensity modulation of the pattern, due to the induced inter-mode phase differences caused by the microbends, is a measure of the strength of the current.

Suitable multi-mode optical fibers are conveniently commercially available, and, as is well-known, comprise a central core and a glass cladding concentrically surrounding the core. The core portion is preferably high-purity $SiO_2$ or doped silica having a first index of refraction $n_1$. The guiding or cladding portion may be $SiO_2$ or any suitable glass material having a slightly lower index of refraction $n_2$. The core may have a uniform index of refraction or it may comprise two or more layers, with each successive layer being of lower index than that underlying so as to approximate the parabolic gradient of particular utility in multi-mode structures. The cladding is usually of uniform composition but may also be of graded composition. The second index of refraction is generally at least about 0.1%, and preferably about 1%, less than the first index of refraction in order to produce total internal reflection of optical radiation at the core/clad interface and thereby guide the optical radiation along the waveguide. The multi-mode fiber permits use of simpler detection methods than are required for single mode fibers, which require interferometers and associated apparatus. The ratio of the core radius to clad thickness typically ranges from about 0.2 to 0.8. A ratio smaller than about 0.2 implies single mode fibers; a ratio larger than about 0.8 introduces excessive microbending. The total diameter of the multi-mode fibers typically ranges from about 100 to 200 μm.

The optical fiber is associated with a metal portion capable of efficiently conducting electricity. Many composite configurations may be employed, such as a metallic strip or wire bonded along a portion 11a of the length of the optical fiber 11. For ease of fabrication and convenience, the optical fiber is preferably provided with a metallic coating, which may comprise any metal or alloy which efficiently conducts electricity. Suitable metals include aluminum and copper; a suitable alloy includes Al-Bi, containing about 0.1 to 0.2 at % bismuth. The process for forming the metal coating and its thickness are not critical, except that the coating be thick enough to efficiently conduct electricity and not so thick as to adversely impair the flexibility of the optical fiber. Typical metallic coatings range from about 10 to 200 μm.

1. Fiber Optic Current Sensor

In the current sensor, the magnetic field is generally known. The unknown current is provided by current source 12 and may range from zero to some finite value. This current is tapped from a current-generating device such as a motor in a remote location, the status of operation of which is important to know; that is, however, whether the current-generating device is functioning or not. Application of an appropriate reference current signal (not shown) permits determination of the value of the unknown current. On the other hand, a very simple device for detecting the presence or absence of an electrical current may be constructed employing a magnetic field of unknown but essentially constant strength.

The magnetic field may be provided by permanent magnets or electromagnets. For permanent magnets, the magnetic field is conveniently about 1 kGauss. Such a field permits sensing currents from about 5 mA to over 2 A. Higher fields may be more easily achieved with electromagnets and provide increased sensitivity of the sensor. Varying current signals from current source 12 may be detected by using electromagnets excited with direct current or by using permanent magnets. Direct current signals from current source 12 may be detected by using electromagnets excited with varying current.

Figure 2:
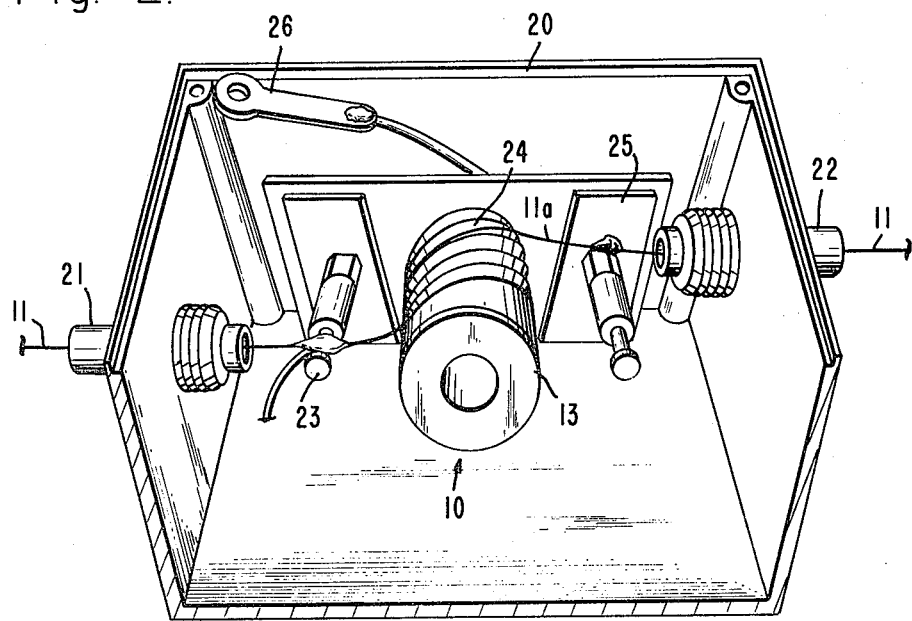
FIG. 2 is a perspective view of one embodiment of the current sensing element of the invention.
Figure 3:
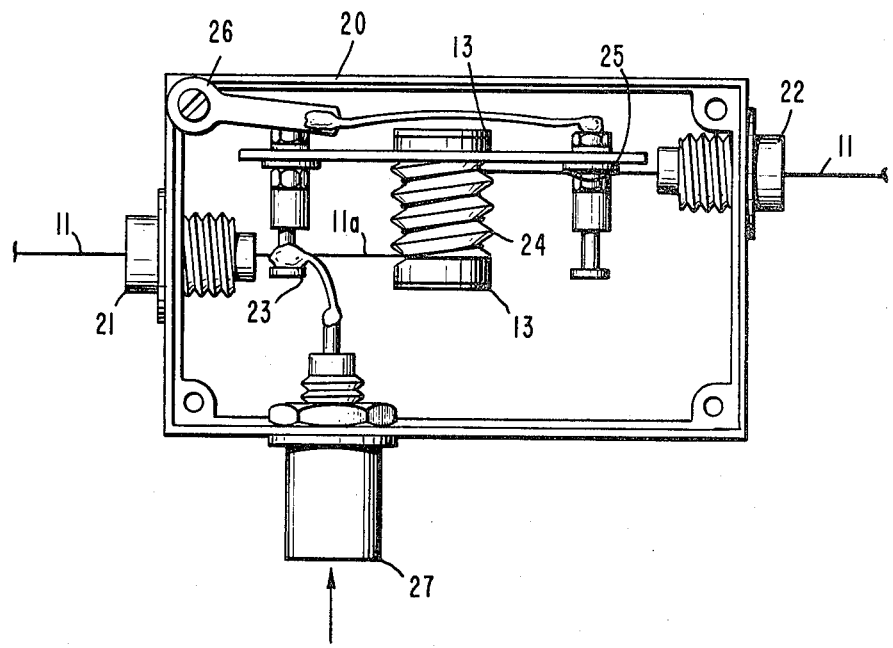
FIG. 3 depicts a top view of the device of FIG. 2.
Figure 4:
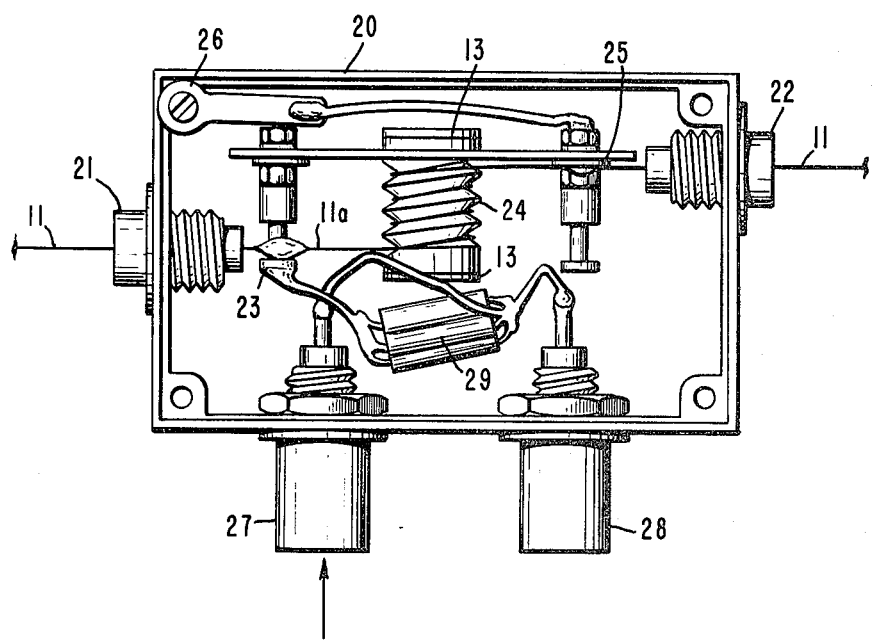
FIG. 4 depicts a top view of an alternate embodiment.

A simple, compact configuration is depicted in FIGS. 2-4; FIG. 2 is a perspective view of one embodiment, while FIG. 3 is a top view of the device of FIG. 2 and FIG. 4 is a top view of an alternate embodiment. A current sensing element is housed in a metal casing 20, which contains entrance and exit ports 21 and 22, respectively, for optical fiber 11. Here, a metallic coated optical fiber is employed. The fiber contacts a current-carrying stud 23, which is electrically insulated from the casing. The fiber is wound around a mandrel 24, to the ends of which are attached magnets 13.

The fiber then contacts a metal pad 25, which in turn is connected to ground strap 26, which, upon assembly, is grounded to the metal casing 20. Current input, seen more clearly in FIG. 3, is via input 27, which conveniently permits connection of a shielded cable (not shown) from a current source 12, the shielded portion of which is grounded to the metal casing, thereby completing the electrical circuit.

If desired, the current signal may be monitored in conjunction with the detector output; such a configuration is depicted in FIG. 4, and is useful for calibration purposes. An additional shielded cable output 28 is provided. For the calibration, the voltage drop across a resistor 29 in series with the sensor is monitored.

2. Fiber Optic Magnetic Field Sensor

In the magnetic field sensor, the electric current is generally known. The unknown magnetic field 13a is provided by magnets or is generated by a running motor. Application of an appropriate reference magnetic field (not shown) permits determination of the value of the unknown magnetic field. Again, as with the current sensor, the value of the electric current need not be known in order to detect only the presence or absence of a magnetic field.

The electric current may range from about 5 mA to about 50 A; this current range permits detection of a magnetic field ranging from about 0.1 G to about 1 kG in strength. The current may be direct or alternating.

EXAMPLE

Figure 5:
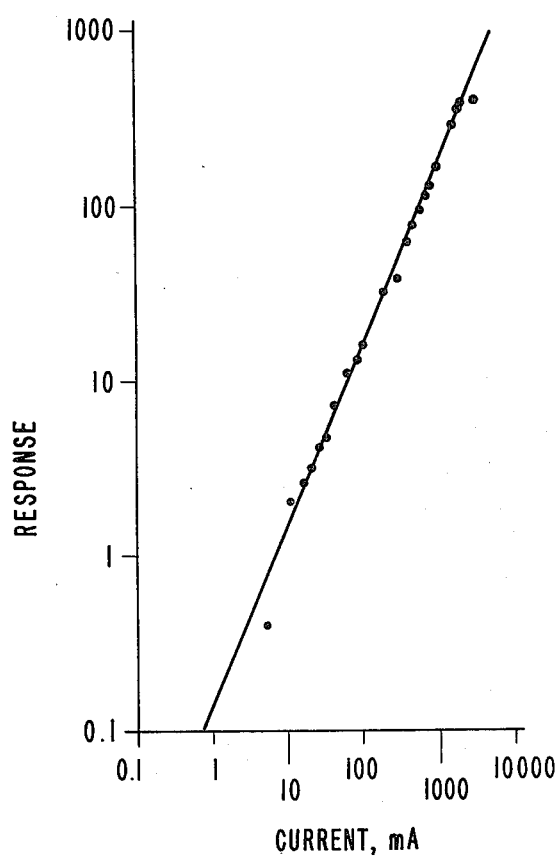
FIG. 5, on coordinates of detector signal and current amplitude, depicts the linearity of the device of FIG. 4.

A device similar to that depicted in FIG. 4 for detecting an unknown current was constructed. An aluminum clad optical fiber was employed having a resistance per unit length of 7.2 Ω/m. The fiber waveguide parameters were 35 μm core (diameter), 175 μm clad (diameter) and numerical aperture of about 0.20. The fiber was wrapped onto a cylindrical mandrel 1 cm in diameter, the mandrel having ridges along its length. A total of 9 cm of fiber was wound onto the mandrel. The spacing between the ridges allowed for microbending of the fiber. A pair of permanent magnets were attached to the two ends of the mandrel, the total transducer size being 0.8 cm long and 1.3 cm in diameter. The magnetic field on the fiber was about 1 kG. The device was tested using an AC current (7 kHz) drive. The detected signal was the amplitude modulation due to the modulation of a speckle pattern. The detector was placed at the center of the output pattern, with about 1/20 of the pattern being detected. The detector signal was amplified using a tuned amplifier. A plot of the detector signal response versus current amplitude in mA is shown in FIG. 5. Good linearity is seen from 5 mA to 2,000 mA. Threshold detection behavior at the very low current range (5 mA) and a fading of the signal at high current (greater than 2 A) were observed. Mechanical resonances were observed to enhance the response in the audio range. These resonances arise due to increased microbending at specific frequencies. The mechanical resonances may be exploited if a fixed frequency of current signals is being observed. The resonant enhancement of the response can be designed to optimize the sensitivity.

What is claimed is:

1. A fiber optic transducer including:
   (a) a multi-mode optical fiber adapted to transmit optical radiation, at least a portion of said optical fiber also adapted to conduct electricity;

(b) means for introducing optical radiation into said optical fiber;

(c) means for impressing a current on said portion adapted to conduct electricity;

(d) means for applying a magnetic field to a portion of the current-carrying optical fiber; and (e) means for providing an optical output from said optical fiber.

2. The transducer of claim 1 additionally including a source of optical radiation connected to said means for introducing optical radiation into said fiber.

3. The transducer of claim 1 additionally including a detector connected to said optical output means for detecting any changes in said optical output induced in said optical radiation resulting from an interaction of said magnetic field on said current-carrying optical fiber.

4. The transducer of claim 1 in which at least said portion of said optical fiber comprises a metallic clad optical fiber.

5. Fiber optic sensing apparatus comprising:

(a) a multi-mode optical fiber adapted to transmit optical radiation, at least a portion of said optical fiber also adapted to conduct electricity;

(b) a source of optical radiation;

(c) means for introducing said optical radiation into said optical fiber;

(d) means for impressing a current on said portion adapted to conduct electricity;

(e) means for applying a magnetic field to a portion of the current-carrying optical fiber;

(f) means for providing an optical output; and (g) means for detecting any changes in said optical output induced in said optical radiation resulting from an interaction of said magnetic field on said current-carrying optical fiber.

6. The apparatus of claim 5 in which at least said portion of said optical fiber comprises a metallic clad optical fiber.

7. A method for sensing the presence or absence of electrical current or a magnetic field comprising:

(a) providing an optical fiber capable of transmitting optical radiation, at least a portion of said optical fiber adapted to conduct electricity;

(b) introducing optical radiation into said optical fiber;

(c) introducing at least a portion of current from a current-generating device onto said portion adapted to conduct electricity;

(d) applying a magnetic field to a portion of the current-carrying optical fiber; and (e) detecting any change in the transmission of the optical radiation.

8. The method of claim 7 in which at least said portion of said optical fiber is provided with a metallic coating.

9. The method of claim 7 in which an unknown electrical current is determined by applying a magnetic field of a known strength.

10. The method of claim 7 in which an unknown magnetic field is determined by introducing an electrical current of a known value.

* * * * *